(12) United States Patent
Liu et al.

(10) Patent No.: US 11,469,398 B2
(45) Date of Patent: Oct. 11, 2022

(54) DISPLAY PANEL, DISPLAY DEVICE AND METHOD OF MANUFACTURING DISPLAY PANEL

(71) Applicant: Yungu (Gu'an) Technology Co., Ltd., Langfang (CN)

(72) Inventors: Shengfang Liu, Kunshan (CN); Ping Zhu, Kunshan (CN); Qingqing Dong, Kunshan (CN); Xueyuan Li, Kunshan (CN); Yibo Zhang, Kunshan (CN); Haojie Zhang, Kunshan (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 134 days.

(21) Appl. No.: 16/840,612

(22) Filed: Apr. 6, 2020

(65) Prior Publication Data

US 2020/0235337 A1  Jul. 23, 2020

Related U.S. Application Data

(63) Continuation of application No. PCT/CN2019/089599, filed on May 31, 2019.

(30) Foreign Application Priority Data

Sep. 30, 2018 (CN) .......................... 201811158203.8

(51) Int. Cl.
 *H01L 51/52* (2006.01)
 *H01L 27/32* (2006.01)
 *H01L 51/56* (2006.01)

(52) U.S. Cl.
 CPC ...... *H01L 51/5253* (2013.01); *H01L 27/3246* (2013.01); *H01L 51/56* (2013.01)

(58) Field of Classification Search
 CPC ....... H01L 51/5253–5256; H01L 51/56; H01L 27/3246
 See application file for complete search history.

(56) References Cited

U.S. PATENT DOCUMENTS

2003/0094615 A1* 5/2003 Yamazaki ........... H01L 27/3244
 257/72
2016/0104867 A1 4/2016 Lee et al.
(Continued)

FOREIGN PATENT DOCUMENTS

CN 102738408 A 10/2012
CN 103943786 A 7/2014
(Continued)

OTHER PUBLICATIONS

Office Action and Search Report dated Aug. 5, 2019, in corresponding Chinese application No. 201811158203.8; 9 pages.
(Continued)

*Primary Examiner* — Shaun M Campbell
(74) *Attorney, Agent, or Firm* — Maier & Maier, PLLC (57) ABSTRACT

A display panel, a display device, and a method of manufacturing a display panel are provided. As an example, the display panel includes an array layer, a planarization layer, an inorganic layer, and at least one dam. The array layer includes a first region and a second region surrounding the first region. The planarization layer is at least partially located on a portion of the array layer which is at the first region. The inorganic layer is located on a portion of the array layer which is at the second region. The at least one dam is formed on the inorganic layer.

17 Claims, 4 Drawing Sheets

(56) References Cited

U.S. PATENT DOCUMENTS

| | | | |
|---|---|---|---|
| 2017/0287995 A1* | 10/2017 | Kim | .................... H01L 51/5253 |
| 2018/0006259 A1 | 1/2018 | Paek et al. | |
| 2018/0061918 A1 | 3/2018 | Park et al. | |
| 2018/0226454 A1* | 8/2018 | Liu | ....................... H01L 27/323 |
| 2019/0207144 A1 | 7/2019 | Luo | |
| 2020/0006697 A1* | 1/2020 | Jung | ................... H01L 27/3246 |
| 2020/0052051 A1* | 2/2020 | Lee | ..................... H01L 27/3246 |
| 2020/0067016 A1* | 2/2020 | Park | .................... H01L 27/3276 |
| 2020/0083475 A1* | 3/2020 | Kang | ................. H01L 27/3258 |

FOREIGN PATENT DOCUMENTS

| | | |
|---|---|---|
| CN | 104505468 A | 4/2015 |
| CN | 105514143 A | 4/2016 |
| CN | 107068715 A | 8/2017 |
| CN | 107275506 A | 10/2017 |
| CN | 107546243 A | 1/2018 |
| CN | 107565034 A | 1/2018 |
| CN | 107768402 A | 3/2018 |
| CN | 108054291 A | 5/2018 |
| CN | 108172604 A | 6/2018 |
| CN | 109326738 A | 2/2019 |

OTHER PUBLICATIONS

International Search Report dated Sep. 5, 2019 in corresponding International application No. PCT/CN2019/089599; 6 pages.
Written Opinion of the International Searching Authority dated Sep. 5, 2019, in corresponding International application No. PCT/CN2019/089599; 8 pages.

* cited by examiner

DISPLAY PANEL, DISPLAY DEVICE AND METHOD OF MANUFACTURING DISPLAY PANEL

CROSS REFERENCE TO RELATED APPLICATIONS

This application is a Continuation Application of International Patent Application No. PCT/CN2019/089599, filed on May 31, 2019, which claims priority to Chinese Patent Application No. 2018111582038, titled "DISPLAY PANEL, DISPLAY DEVICE AND METHOD OF MANUFACTURING DISPLAY PANEL", filed on Sep. 30, 2018, the contents of all of which are incorporated herein by reference.

TECHNICAL FIELD

The present application relates to the field of display technologies.

BACKGROUND

The organic light-emitting diode (referred briefly to as OLED) is an electroluminescent element, and has the advantages of active luminescence and high luminous efficiency, so the OLED has been more widely used in the field of illumination and display. An OLED device emits light through internal OLED light emitting elements, and the OLED light emitting elements are sensitive to external factors such as water vapor and oxygen.

SUMMARY

The present application provides a display panel, a display device, and a method of manufacturing the display panel, which may effectively restrict water vapor and oxygen from entering OLED light emitting elements.

The present application provides a display panel, and the display panel includes: an array layer including a first region and a second region surrounding the first region; a planarization layer at least partially located on a portion of the array layer which is at the first region; an inorganic layer located on a portion of the array layer which is at the second region; and at least one dam located on the inorganic layer.

Further, the display panel includes an inorganic encapsulation layer, wherein the inorganic layer together with the inorganic encapsulation layer surround the at least one dam.

Further, the inorganic layer includes a first inorganic layer and a second inorganic layer which are spaced apart from each other; the at least one dam includes a first dam and a second dam, the first inorganic layer and the inorganic encapsulation layer surround the first dam, and the second inorganic layer and the inorganic encapsulation layer surround the second dam.

Further, the second dam is higher than the first dam.

Further, the second dam includes a pixel defining layer located on the inorganic layer and a support pillar located on the pixel defining layer, and the first dam excludes a pixel defining layer.

Further, the first dam and the second dam surround the first region.

Further, the planarization layer includes a first planarization portion and a second planarization portion, and the inorganic layer is located between the first planarization portion and the second planarization portion.

Further, the planarization layer is an organic layer.

Further, a material of the inorganic layer includes at least one of silicon nitride, silicon oxide, or aluminum oxide.

Further, the inorganic layer has a thickness ranging from 1 μm to 1.5 μm.

Further, the array layer includes a thin film transistor in the first region.

The present application further provides a display device, and the display device includes any one of the display panel as described above.

The present application further provides a method of manufacturing a display panel, and the method includes: forming a planarization film layer on an array layer, where the array layer includes a first region and a second region that surrounds the first region; patterning the planarization film layer to at least partially remove a portion of the planarization film layer which is on the second region, so as to form a planarization layer; forming an inorganic layer on the second region of the array layer; and forming at least one dam on the inorganic layer.

Further, forming the inorganic layer on the second region of the array layer includes: forming, on the second region of the array layer, a first inorganic layer and a second inorganic layer which are spaced apart from each other.

Further, forming the at least one dam on the inorganic layer includes: forming, on the inorganic layer, a first dam and a second dam that surround the first region.

Further, forming the inorganic layer on the second region of the array layer includes: forming the inorganic layer on the second region of the array layer through a chemical vapor deposition process, where a deposition temperature of the chemical vapor deposition process is from 300° C. to 500° C.

Further, forming the inorganic layer on the second region of the array layer includes: forming the inorganic layer on the second region of the array layer through a sputtering process.

According to the present application, water and oxygen are blocked by the inorganic layer, which effectively restricts water vapor and oxygen from entering the first region. As such, the service life of the light emitting element is lengthened.

DETAILED DESCRIPTION OF THE EXAMPLES

Various embodiments will be described in detail herein, examples of which are illustrated in the accompanying drawings. When the following descriptions involve the drawings, like numerals in different drawings represent like or similar elements unless stated otherwise. The implementations described in the following exemplary embodiments do not represent all implementations consistent with the present application. On the contrary, they are merely examples of an apparatus and a method consistent with some aspects of the present application as recited in detail in the appended claims.

Figure 1:
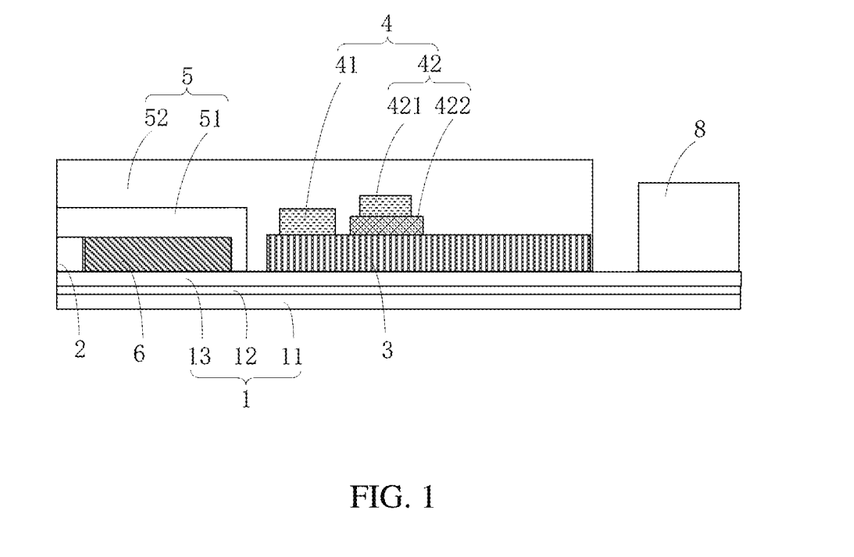
FIG. 1 is a schematic structural view illustrating a display panel according to an example of the present application.

Referring to FIG. 1, a display panel according to an example of the present application, such as a hard screen or a flexible screen, includes a substrate 11, a barrier layer 12, an array layer 13, a light emitting element 2, an inorganic layer 3, a dam 4, a planarization layer 6, an encapsulation layer 5 and pins 8. A direction from the substrate 11 to the array layer 13 is defined as an upward direction. A direction from the array layer 13 to the substrate 11 is defined as a downward direction. Different ways for defining the direction do not affect the manner of process, and the actual form of a product.

The substrate 11 may be a rigid substrate (corresponding to the hard screen) or a flexible substrate (corresponding to a flexible screen). In an example, the substrate is a transparent plastic substrate, and the material of the substrate is, for example, at least one of polycarbonate (referred briefly to as PC), polyethylene terephthalate (referred briefly to as PET), poly(ethylene 2,6-naphthalate) (referred briefly to as PEN), polyether sulfone (referred briefly to as PES), or polyimide (referred briefly to as PI). The barrier layer 12 may prevent the diffusion between copper and other materials. The barrier layer 12 may be made of an aluminum oxide (for example, $Al_2O_3$) layer. The barrier layer 12 may be prepared through an Atomic Layer Deposition (referred briefly to as ALD) process.

Figure 4:
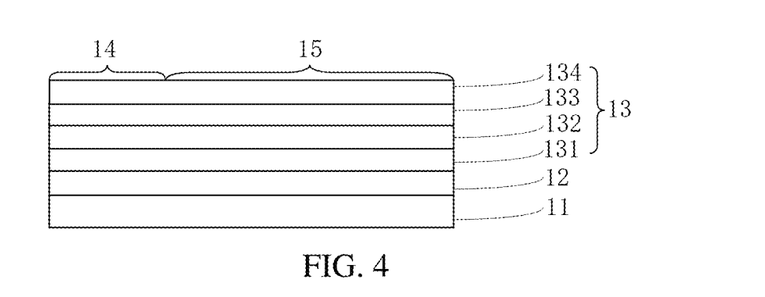
FIG. 4 is a schematic structural view illustrating an array layer formed by a method of manufacturing a display panel according to an example of the present application.

The array layer 13 includes a first region 14 and a second region 15. The second region 15 surrounds the first region 14. Referring to FIG. 4, the first region 14 and the second region 15 are arranged in a lateral direction, which is perpendicular to the upward direction and the downward direction. The array layer 13 includes a plurality of thin film transistors (TFTs) (not shown) located in the first region 14, so as to drive the light emitting element 2. The light emitting element 2 is located on the TFTs. The planarization layer 6 is at least partially located on a portion of the array layer 13 which is at the first region 14. The inorganic layer 3 is located on a portion of the array layer 13 which is at the second region 15. That is, the planarization layer 6 is located in the first region 14, and the inorganic layer 3 is located in the second region 15. The dam 4 is located on the inorganic layer 3. The inorganic layer 3 and the dam 4 surround the first region 14.

The light emitting element 2 includes a first electrode on the array layer 13, a pixel defining layer and an organic light emitting layer on the first electrode, and a second electrode (not shown) on the organic light emitting layer. The pixel defining layer defines a pixel opening, and the organic light emitting layer is located within the pixel opening. The light emitting element 2 further includes a hole injection layer, a hole transport layer, an electron injection layer, and an electron transport layer. Driven by an external voltage, holes and electrons are injected into the organic light emitting layer from the first electrode and the second electrode respectively. The holes and electrons meet and combine in the organic light emitting layer to release energy and transfer the energy to molecules of organic light emitting substances, which causes the molecules to transit from a ground state to an excited state. The molecules in the excited state are unstable, and the molecules return from the excited state to the ground state, so as to emit light in the irradiative transition process.

The planarization layer 6 is located on the array layer 13, and the planarization layer may planarize an upper surface of the array layer. The planarization layer 6 may be made of an organic insulation material such as an acrylic resin, an epoxy resin, a phenolic resin, or a polyamide resin. A connection hole of the first electrode and the TFTs is disposed in the planarization layer 6.

Figure 6:
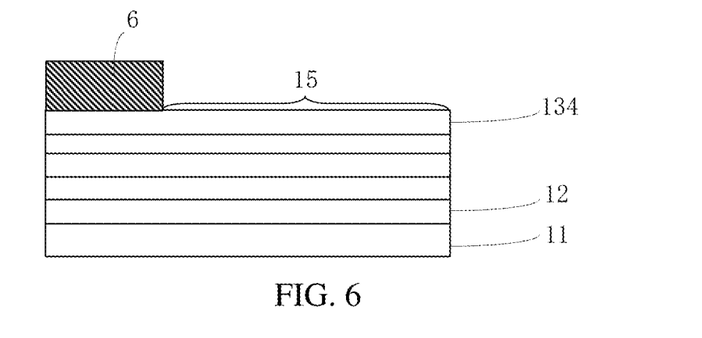
FIG. 6 is a schematic structural view illustrating a patterning process performed on a planarization film layer based on a method of manufacturing a display panel according to an example of the present application.
Figure 7:
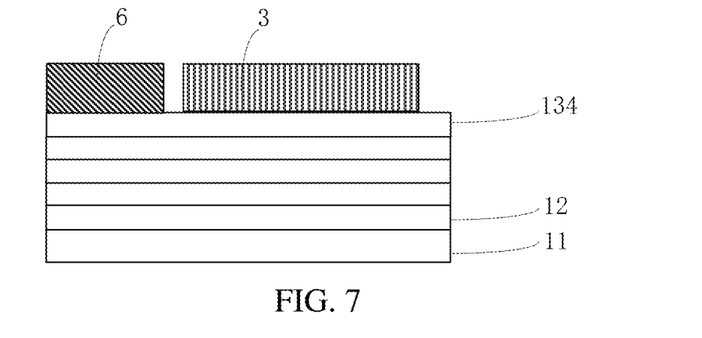
FIG. 7 is a schematic structural view illustrating an inorganic layer formed by a method of manufacturing a display panel according to an example of the present application.

Referring to FIGS. 6 and 7, the inorganic layer 3 is located on the second region 15. In an example, the inorganic layer 3 is located on an entire region of the second region 15. In another example, the inorganic layer 3 is located on a partial region of the second region 15. The inorganic layer 3 may be formed through a Chemical Vapor Deposition (referred briefly to as CVD) process or a Sputter process. In this example, the CVD process is taken as an example. At a high temperature, for example, a temperature of 300° C. to 500° C., a gas phase reaction is performed. An inorganic film layer is formed on the second region 15, and a patterning process is performed on the inorganic film layer, so as to form the inorganic layer 3. Specifically, a mask deposition or etching process may be selected as the patterning process. A top layer, i.e., an uppermost layer, of the array layer 13 is a metal layer 134. The inorganic layer, i.e., the inorganic film layer, formed through the CVD process at the high temperature has good quality and strong adhesion to the metal layer 134, which is less prone to occur the peeling action. The liquid such as water vapor and the gas such as oxygen easily permeate into the first region 14 through the organic materials in the planarization layer, which causes oxidation and malfunction of the light emitting element 2. In this example, by replacing the partial planarization layer with the inorganic layer 3, it is possible to block the liquid such as water vapor and the gas such as oxygen, and effectively restrict the liquid and the gas from entering the first region 14, thereby lengthening the service life of the light emitting element.

In an example, the inorganic layer 3 is made of at least one of silicon nitride (for example, SiN), silicon oxide ($SiO_x$, including SiO, $SiO_2$ or the like), or aluminum oxide (for example, $Al_2O_3$).

In an example, the inorganic layer 3 has a thickness ranging from 1 μm to 1.5 μm, such as 1.1 μm, 1.2 μm, 1.3 μm, and 1.4 μm. Compared with inorganic layers made of other materials or having other thicknesses, the inorganic layer 3 in this example has stronger adhesion to the metal layer 134, which is less prone to occur the peeling action. As such, the inorganic layer may withstand greater stressing force, and has a longer service life.

The dam 4 is used to limit the outward flow of the organic materials in the light emitting element 2. There may be one dam 4, or two or more dams 4. Two dams 4 are provided in this example. The dams 4 include an inner dam 41, i.e., a first dam, and an outer dam 42, i.e., a second dam. The inner dam 41 is closer to the first region 14 than the outer dam 42.

An upper surface of the outer dam 42 is higher than an upper surface of the inner dam 41. In an example, the outer dam 42 includes a pixel defining layer 422 (configured to define a pixel opening) on the inorganic layer 3 and a support pillar 421 on the pixel defining layer. The inner dam 41 includes a support pillar, and does not include a pixel defining layer. A height of the support pillar 421 in the outer dam 42 is substantially the same as that of the support pillar in the inner dam 41, and thus the upper surface of the outer dam 42 is higher than the upper surface of the inner dam 41.

The encapsulation layer 5 is used to encapsulate the first region 14 and the second region 15. The encapsulation layer 5 includes an organic encapsulation layer 51 and an inorganic encapsulation layer 52. The organic encapsulation layer 51 encapsulates the TFTs, the light emitting element 2, as well as other film layers in the first region 14, and the inorganic encapsulation layer 52 is located on an outer side of the organic encapsulation layer 51. The inorganic encapsulation layer 52 together with the inorganic layer 3 surround the dam 4. Specifically, the inorganic encapsulation layer 52 and the inorganic layer 3 respectively surround the inner dam 41 and the outer dam 42. Both the inorganic layer 3 and the inorganic encapsulation layer 52 have a good ability to block water and oxygen. That is, it is difficult for water vapor and oxygen to pass through the inorganic layer 3 and/or the inorganic encapsulation layer 52 to enter the first region 14, and cannot pass through the organic materials in the dam 4 to enter the first region 14 and even the dam 4, thereby reducing the possibility of malfunction of the light emitting element 2 which is resulted from contact with the liquid and the gas such as water and oxygen.

In this example, the inorganic layer 3 surrounds a bottom portion of the dam 4. In other examples, the inorganic layer 3 may also surround the various surfaces of the dam 4. For example, it is possible to, after the inorganic film layer is formed, form a depressed portion through the patterning process, and form the dam in the depressed portion, such that the inorganic layer surrounds the bottom portion and the periphery of the dam.

The pins 8 are used to electrically connect with other elements such as a controller, and receive a control signal from the controller. Specifically, the pins 8 and other elements may be electrically connected through welding.

Figure 2:
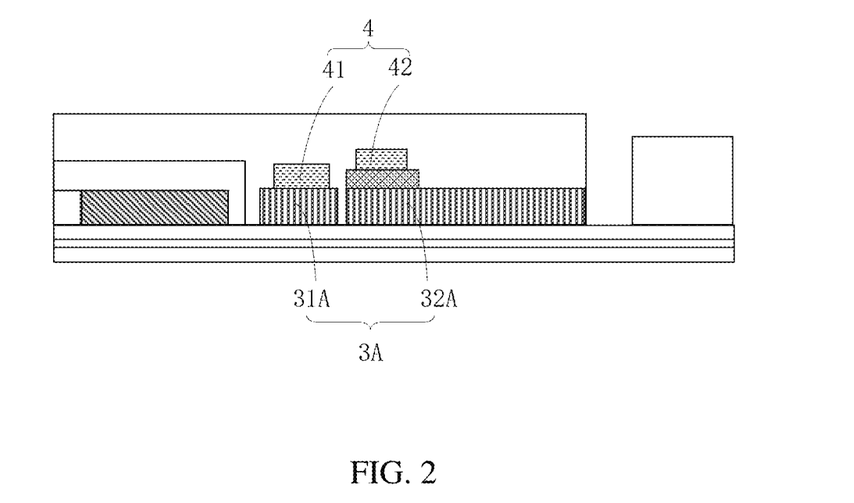
FIG. 2 is a schematic structural view illustrating a display panel according to an example of the present application.

Referring to FIG. 2, this example differs from the example shown in FIG. 1 in terms of the structure of the inorganic layer. The inorganic layer 3A includes a first inorganic layer 31A and a second inorganic layer 32A which are spaced apart from each other. The first inorganic layer 31A and the second inorganic layer 32A are arranged in the lateral direction which is perpendicular to the direction of arranging the substrate 11 as well as the film layers such as the array layer 13 and the inorganic layer 3. The first inorganic layer 31A is located between the second inorganic layer 32A and the first region 14, as shown in FIG. 4. The inner dam 41 is located on the first inorganic layer 31A, and the outer dam 42 is located on the second inorganic layer 32A. That is, the second inorganic layer 32A is located outside of the first inorganic layer 31A. The second inorganic layer 32A together with the inorganic encapsulation layer 52 surround the outer dam 42 to block the liquid and the gas such as water vapor and oxygen from entering the first region 14 from the outer dam 42. The first inorganic layer 31A together with the inorganic encapsulation layer 52 surround the inner dam 41 to block the liquid and the gas such as water vapor and oxygen from entering the first region 14 via the inner dam 41. The inner dam 41 and the outer dam 42 are surrounded by the first inorganic layer, the second inorganic layer and the inorganic encapsulation layer, which is advantageous for further improving the ability of blocking water and oxygen.

Figure 3:
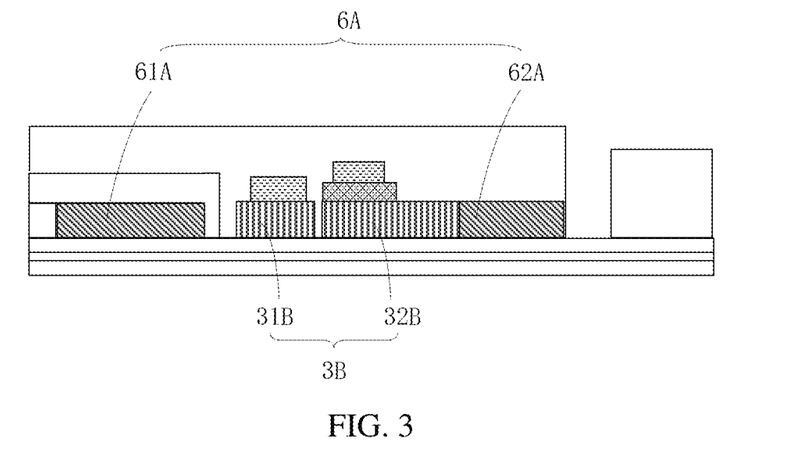
FIG. 3 is a schematic structural view illustrating a display panel according to an example of the present application.

Referring to FIG. 3, this example differs from the example shown in FIG. 2 in terms of the structures of the planarization layer and the inorganic layer. A planarization layer 6A is located on the array layer 13, and the planarization layer 6A includes a first planarization portion 61A and a second planarization portion 62A. After a planarization film layer 6B (see FIG. 5) is formed, the first planarization portion 61A and the second planarization portion 62A are formed through the patterning process, for example, removing the partial planarization film layer on the second region 15 by etching. The second planarization portion 62A is located in the second region 15, and the first planarization portion 61A is located in the first region 14. The first planarization portion 61A may also be located in the first region 14 and the second region 15. The inorganic layer 3B is located in the second region 15 of the array layer 13 and between the first planarization portion 61A and the second planarization portion 62A. Since the first planarization portion 61A and the second planarization portion 62A both are organic layers with the better flexibility, and the first planarization portion 61A and the second planarization portion 62A are disposed on both sides of the inorganic layer, the stressing force, to which the inorganic layer 3B is subject during its bending, may be dispersed through the first planarization portion 61A and the second planarization portion 62A, so as to prevent the inorganic layer 3B from being broken or peeled off. Compared with the example shown in FIG. 2, it is equivalent to replacing the second inorganic layer 32A with the second planarization portion 62A and the second inorganic layer 32B, and the first inorganic layer 31B may be equivalent to the first inorganic layer 31A. Even if water vapor and oxygen pass through the second planarization portion 62A, they are blocked by the second inorganic layer 32B. The second planarization portion 62A formed by the organic materials may reduce the stressing force between the inorganic film layers such as the inorganic encapsulation layer and the inorganic layer, improve the bending property, and enable the display panel to be flexible. In an example, the display panel is a flexible display panel.

The present application also provides a display device, including a display panel according to any of examples described above. In an example, the display device may further include a frame, an outer casing, and other structures, which are not illustrated in this example. The display device may be used in an apparatus having a display function, such as a mobile phone, a tablet computer, a notebook computer, a television, an e-book, and an electronic photo frame.

Figure 8:
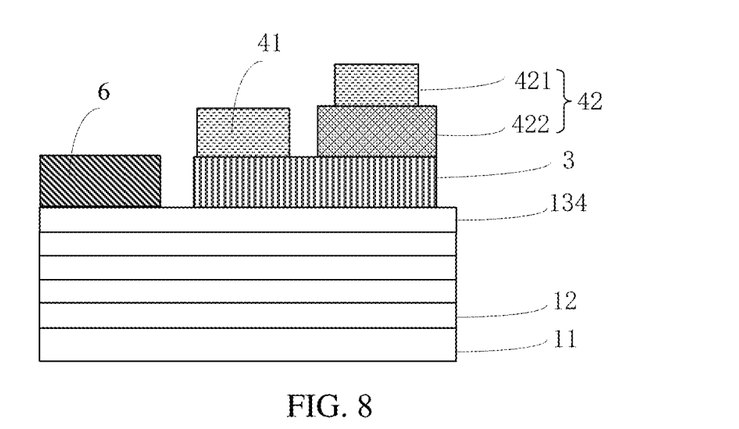
FIG. 8 is a schematic structural view illustrating a dam formed by a method of manufacturing a display panel according to an example of the present application.
Figure 9:
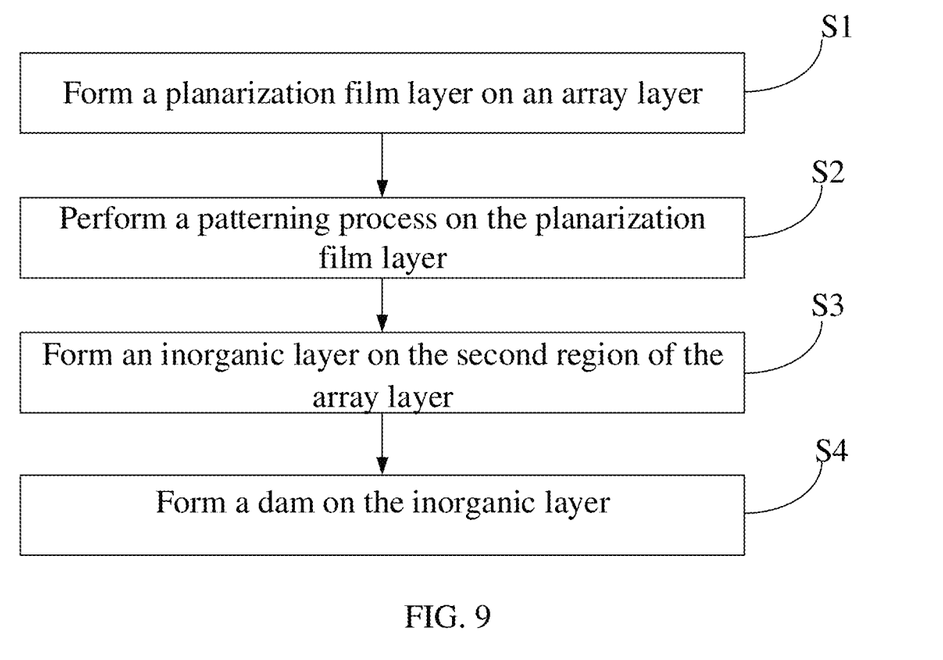
FIG. 9 is a schematic flowchart illustrating a method of manufacturing a display panel according to an example of the present application.

Referring to FIGS. 4 to 9, a method of manufacturing a display panel is described below, which may be used to manufacture the display panel in any of examples described above. Taking the display panel shown in FIG. 1 as an example, as shown in FIG. 9, the manufacturing method includes steps S1 to S4.

At step S1, a planarization film layer 6B is formed on an array layer 13.

In a specific example, as shown in FIG. 4, a barrier layer 12 is formed on a substrate 11, and then an array layer 13 is formed on the barrier layer 12. The array layer 13 includes a first region 14 and a second region 15 around the first region 14. Next, a planarization film layer 6B is coated on the array layer 13.

The material of the substrate 11 may be one or more of PEN, PET, PI, PES, PC, or PEI.

Figure 5:
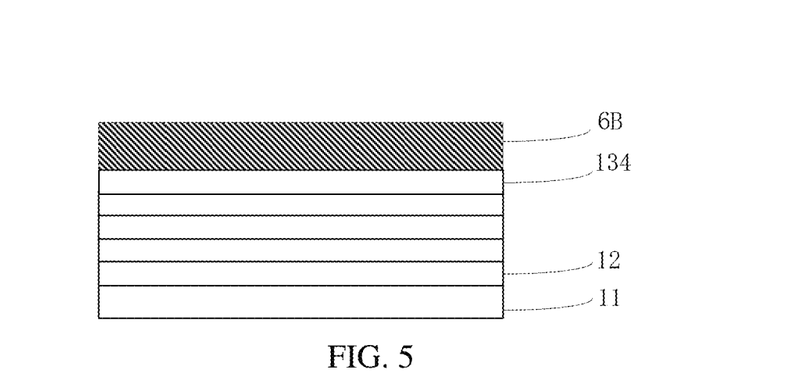
FIG. 5 is a schematic structural view illustrating a planarization film layer formed by a method of manufacturing a display panel according to an example of the present application.

In a specific example, as shown in FIG. 4, the array layer 13 includes a gate insulation layer 131, a capacitor insulation layer 132, an interlayer dielectric layer 133, and a metal layer 134. Therefore, as shown in FIG. 5, the step of forming a planarization film layer 6B on the array layer 13 may specifically include forming the planarization film layer 6B on the metal layer 134. A plurality of TFT elements (not shown) are arranged in the array layer 13. The TFT elements may include a gate, a source, a drain, and other structures.

The material of the planarization film layer 6B may be an organic insulation material such as an acrylic resin, an epoxy resin, a phenolic resin, and a polyamide resin.

At step S2, a patterning process is performed on the planarization film layer 6B.

In a specific example, as shown in FIG. 6, a part or a whole of the planarization film layer 6B on a second region 15 is removed through an etching process or a mask deposition process to expose the second region 15, so as to form a planarization layer 6.

At step S3, an inorganic layer 3 is formed on the second region 15 of the array layer 13.

In a specific example, as shown in FIG. 7, the inorganic layer 3 may be formed through a CVD process or a Sputter process. In this example, taking the CVD process as an example, the inorganic layer 3, which is formed by a gas phase reaction at a high temperature of 300° C.-500° C. such as 350° C., 400° C. and 450° C., has a larger adhesion to the metal layer 134 of the array layer 13. The inorganic layer 3 may block water vapor and oxygen, and effectively restrict the liquid and the gas such as water and oxygen from entering the first region, thereby lengthening the service life of a light emitting element.

The inorganic layer 3 may be made of at least one of silicon nitride (for example, SiN), silicon oxide $SiO_x$, or aluminum oxide (for example, $Al_2O_3$). The thickness of the inorganic layer 3 ranges from 1 µm to 1.5 µm. Compared with inorganic layers made of other materials or having other thicknesses, the inorganic layer in this example has stronger adhesion to the array layer, which is less prone to occur the peeling action.

A light emitting element 2 is formed on the TFTs. That is, a first electrode, an organic light emitting layer, and a second electrode are sequentially formed on the TFTs, and the first electrode is electrically connected to the TFT elements.

In an example, a first electrode layer is formed on TFTs, so that the first electrode layer is electrically connected to the TFTs, and then the first electrode layer is separated into a plurality of first electrodes, for example, anodes, through the patterning process. The patterning process is, for example, a layout process or a printing process. The layout process includes, for example, coating, exposing, developing, etching, and/or stripping the photoresist.

Thereafter, the pixel definition material is deposited on the first electrodes, and then a pixel defining layer is formed by etching the pixel definition material. The formed pixel defining layer defines a plurality of pixel openings. The organic light emitting material is filled within the pixel openings to form an organic light emitting layer.

In addition to the organic light emitting layer, a hole transport layer, an electron transport layer, or the like may be filled within the pixel openings, which is not described herein.

Then, a second electrode is formed on the organic light emitting layer. The second electrode, for example, a cathode, may not be patterned, and may be formed on the organic light emitting layer as a continuous layer.

Optionally, after the second electrode is formed, a touch layer is formed. The specific touch mode may include a capacitive touch, a resistive touch, or an optical touch. In this example, the capacitive touch is used.

At step S4, a dam 4 is formed on the inorganic layer 3.

In a specific example, as shown in FIG. 8, an inner dam 41 and an outer dam 42 are formed on the inorganic layer 3, and the inner dam 41 is located between the planarization layer 6 and the outer dam 42. The planarization layer 6 is corresponding to a first region 14 of the array layer 13. The inner dam 41 and the outer dam 42 surround the first region 14, such that organic materials of the light emitting element may be prevented from flowing outward. As an example, the outer dam 42 includes a pixel defining layer 421 for defining a pixel opening and a support pillar 421 on the pixel defining layer.

After the dam 4 is formed, the first region 14 and the second region 15 of the array layer 13 are encapsulated.

A metal lid, a glass substrate or a thin film may be used for the encapsulation. In this example, the thin film is used for the encapsulation. Specifically, an organic encapsulation layer 51 and an inorganic encapsulation layer 52 may be used for the encapsulation. The organic encapsulation layer 51 is formed first, and the inorganic encapsulation layer 52 is formed on an outer side of the organic encapsulation layer 51. A low temperature CVD process may be selected as the encapsulation process in which a deposition temperature is usually below 100° C., and the deposition temperature of the low temperature CVD process is lower than a deposition temperature (about 300° C. to 500° C.) of the aforementioned CVD process.

The inorganic encapsulation layer 52 together with the inorganic layer 3 surround the dam 4. In a specific example, the inorganic encapsulation layer 52 and the inorganic layer 3 respectively surround the inner dam 41 and the outer dam 42. The inorganic layer 3 has a good ability to block water and oxygen. That is, it is difficult for the liquid and the gas such as water vapor and oxygen to pass through the organic materials in the dam 4 to enter the first region 14, which reduces the possibility of malfunction of the light emitting element 2 which is resulted from contact with water and oxygen.

To manufacture the display panel shown in FIG. 2, the inorganic film layer may be patterned after the inorganic film layer is formed. For example, the patterning process may be performed through a mask deposition or an etching process to form the inorganic layer 3A. The inorganic layer 3A includes the first inorganic layer 31A and the second inorganic layer 32A which are spaced apart from each other. To manufacture the display panel shown in FIG. 3, a part of the planarization film layer 6B, that is, the second planarization portion 62A, may be left on the second region 15 when the planarization film layer is patterned.

According to the present application, water and oxygen are blocked by the inorganic layer, which effectively restricts water vapor and oxygen from entering the first region. As such, the service life of the light emitting element is lengthened.

The above description is only some examples of the present application, and is not intended to limit the present application. Any modifications, equivalent substitutions, improvements, etc., which are made within the spirit and principle of the present application, shall be included in the protection scope of the present application.

The invention claimed is:
1. A display panel, comprising:
an array layer having a first region and a second region surrounding the first region;
a planarization layer at least partially located on a portion of the array layer at the first region;
an inorganic layer located on a portion of the array layer at the second region; and
at least one dam located on the inorganic layer,
wherein the inorganic layer comprises a first inorganic layer and a second inorganic layer which are spaced apart from each other, and the first inorganic layer and the second inorganic layer are arranged on a same level of the inorganic layer,
wherein the at least one dam comprises a first dam and a second dam,
wherein the second dam consists of a pixel defining layer and a support pillar, the pixel defining layer is located on the inorganic layer and the support pillar is directly located on the pixel defining layer, and the first dam excludes the pixel defining layer,
wherein the first dam is closer to the first region than the second dam,
wherein the display panel further comprises an inorganic encapsulation layer, wherein the inorganic layer together with the inorganic encapsulation layer surround the first dam and the second dam,
wherein the first dam is directly provided on the first inorganic layer, and the pixel defining layer of the second dam is directly provided on the second inorganic layer,
the first inorganic layer and the inorganic encapsulation layer directly surround the first dam, and the second inorganic layer and the inorganic encapsulation layer directly surround the pixel defining layer and the support pillar of the second dam.

2. The display panel according to claim 1, wherein the second dam is higher than the first dam.

3. The display panel according to claim 1, wherein the first dam and the second dam surround the first region.

4. The display panel according to claim 1, wherein the planarization layer comprises a first planarization portion and a second planarization portion, and the inorganic layer is located between the first planarization portion and the second planarization portion.

5. The display panel according to claim 1, wherein the planarization layer is an organic layer.

6. The display panel according to claim 1, wherein a material of the inorganic layer comprises at least one of silicon nitride, silicon oxide, or aluminum oxide.

7. The display panel according to claim 1, wherein the inorganic layer has a thickness range from 1 μm to 1.5 μm.

8. The display panel according to claim 1, wherein the array layer comprises a thin film transistor in the first region.

9. A display device, comprising:
a display panel, the display panel comprising:
an array layer comprising a first region and a second region surrounding the first region;
a planarization layer at least partially located on a portion of the array layer at the first region;
an inorganic layer located on a portion of the array layer at the second region; and
at least one dam located on the inorganic layer,
wherein the inorganic layer comprises a first inorganic layer and a second inorganic layer which are spaced apart from each other, and the first inorganic layer and the second inorganic layer are arranged on a same level of the inorganic layer,
wherein the at least one dam comprises a first dam and a second dam,
wherein the second dam consists of a pixel defining layer and a support pillar, the pixel defining layer is located on the inorganic layer and the support pillar is located on the pixel defining layer, and the first dam excludes the pixel defining layer,
wherein the first dam is closer to the first region than the second dam,
wherein the display panel further comprises an inorganic encapsulation layer, wherein the inorganic layer together with the inorganic encapsulation layer surround the first dam and the second dam,
wherein the first dam is directly provided on the first inorganic layer, and the pixel defining layer of the second dam is directly provided on the second inorganic layer,
the first inorganic layer and the inorganic encapsulation layer directly surround the first dam, and the second inorganic layer and the inorganic encapsulation layer directly surround the pixel defining layer and the support pillar of the second dam.

10. The display device according to claim 9, wherein the display panel further comprises an inorganic encapsulation layer, wherein the inorganic layer together with the inorganic encapsulation layer surround the at least one dam.

11. The display device according to claim 10, wherein the first inorganic layer and the inorganic encapsulation layer surround the first dam, and the second inorganic layer and the inorganic encapsulation layer surround the second dam.

12. The display device according to claim 11, wherein the second dam is higher than the first dam.

13. A method of manufacturing a display panel, comprising:
forming a planarization film layer on an array layer, wherein the array layer comprises a first region and a second region that surrounds the first region;
patterning the planarization film layer to at least partially remove a portion of the planarization film layer which is on the second region, so as to form a planarization layer;
forming an inorganic layer on the second region of the array layer; and
forming at least one dam on the inorganic layer,
wherein forming the at least one dam on the inorganic layer comprises forming, on the inorganic layer, a first dam and a second dam that surround the first region,
wherein forming the second dam consists of:
forming a pixel defining layer on the inorganic layer; and
forming a support pillar on the pixel defining layer,
wherein the first dam is arranged to exclude the pixel defining layer,
wherein the inorganic layer comprises a first inorganic layer and a second inorganic layer which are spaced apart from each other, and the first inorganic layer and the second inorganic layer are arranged on a same level of the inorganic layer,
wherein the first dam is closer to the first region than the second dam,
wherein the display panel further comprises an inorganic encapsulation layer, wherein the inorganic layer together with the inorganic encapsulation layer surround the first dam and the second dam, wherein the first dam is directly provided on the first inorganic layer, and the pixel defining layer of the second dam is directly provided on the second inorganic layer, the first inorganic layer and the inorganic encapsulation layer directly surround the first dam, and the second inorganic layer and the inorganic encapsulation layer directly surround the pixel defining layer and the support pillar of the second dam.

14. The method according to claim 13, wherein forming the inorganic layer on the second region of the array layer comprises:

forming, on the second region of the array layer, a first inorganic layer and a second inorganic layer which are spaced apart from each other.

15. The method according to claim 13, wherein forming the inorganic layer on the second region of the array layer comprises:

forming the inorganic layer on the second region of the array layer through a chemical vapor deposition process, wherein a deposition temperature of the chemical vapor deposition process is from 300° C. to 500° C.

16. The method according to claim 13, wherein forming the inorganic layer on the second region of the array layer comprises:

forming the inorganic layer on the second region of the array layer through a sputtering process.

17. A display panel, comprising:

an array layer having a first region and a second region surrounding the first region;

a planarization layer at least partially located on a portion of the array layer at the first region;

an inorganic layer located on a portion of the array layer at the second region;

at least one dam located on the inorganic layer; and wherein the inorganic layer comprises a first inorganic layer and a second inorganic layer which are spaced apart from each other, and the first inorganic layer and the second inorganic layer are arranged on a same level of the inorganic layer, the at least one dam comprises a first dam and a second dam, wherein the display panel further comprises an inorganic encapsulation layer, wherein the inorganic layer together with the inorganic encapsulation layer surround the first dam and the second dam, the first inorganic layer and the inorganic encapsulation layer surround the first dam, and the second inorganic layer and the inorganic encapsulation layer surround the second dam, wherein the second dam is higher than the first dam, wherein the second dam consists of a pixel defining layer and a support pillar, the pixel defining layer is located on the inorganic layer and the support pillar is located on the pixel defining layer, and the first dam excludes the pixel defining layer, wherein the first dam is closer to the first region than the second dam, wherein the first dam is directly provided on the first inorganic layer, and the pixel defining layer of the second dam is directly provided on the second inorganic layer.

* * * * *